(12) United States Patent
Cherukkate et al.

(10) Patent No.: US 11,119,532 B2
(45) Date of Patent: Sep. 14, 2021

(54) METHODS AND APPARATUS TO IMPLEMENT MICROPHONES IN THIN FORM FACTOR ELECTRONIC DEVICES

(71) Applicant: Intel Corporation, Santa Clara, CA (US)

(72) Inventors: Sumod Cherukkate, Bangalore (IN); Gopinath K, Bangalore (IN); Prakash Kurma Raju, Bangalore (IN); Ajesh K K, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 16/457,046

(22) Filed: Jun. 28, 2019

(65) Prior Publication Data

US 2019/0324496 A1    Oct. 24, 2019

(51) Int. Cl.
| | |
|---|---|
| *H05K 1/16* | (2006.01) |
| *H05K 5/00* | (2006.01) |
| *H05K 7/00* | (2006.01) |
| *H05K 7/04* | (2006.01) |
| *H04R 1/00* | (2006.01) |
| *H04R 1/02* | (2006.01) |
| *H04R 1/08* | (2006.01) |
| *H04R 1/10* | (2006.01) |

(Continued)

(52) U.S. Cl.
CPC .............. *G06F 1/1605* (2013.01); *H04R 1/08* (2013.01); *H05K 1/111* (2013.01); *H05K 1/189* (2013.01); *H05K 7/04* (2013.01); *H05K 2201/10083* (2013.01)

(58) Field of Classification Search
CPC .......... H05K 1/16; H05K 1/111; H05K 1/189; H05K 5/00; H05K 7/00; H05K 7/04; H04R 1/00; H04R 1/02; H04R 1/08; H04R 1/10; H04R 1/20; H04R 1/32; H04R 3/00; H04R 19/00; H04R 19/04; H04M 1/00; H04M 1/03; G06F 1/18; B81B 3/00; B81C 1/00
USPC ......... 361/749, 679.01, 679.46, 728; 381/74, 381/162, 174, 191, 332, 355, 356, 361, 381/368, 369, 396; 455/575.1; 257/415, 257/419
See application file for complete search history.

(56) References Cited

U.S. PATENT DOCUMENTS

| | | | | |
|---|---|---|---|---|
| 5,457,749 A | * | 10/1995 | Cain ...................... | F01N 1/065 381/71.5 |
| 5,679,013 A | * | 10/1997 | Matsunaga .......... | H01R 13/453 439/144 |

(Continued)

OTHER PUBLICATIONS

Lasermicronics, "Three-dimensional circuits with LDS," www.lasermicronics.com, 2008, 16 pages.

(Continued)

*Primary Examiner* — Xiaoliang Chen
(74) *Attorney, Agent, or Firm* — Hanley, Flight & Zimmerman, LLC

(57) ABSTRACT

Methods and apparatus to implement microphones in thin form factor electronic devices are disclosed. An electronic device includes a chassis having an exterior surface and an interior surface. The chassis includes a plurality of holes extending through the chassis. The plurality of holes are within a 1 mm diameter circular area of the chassis. The electronic device further includes a microphone coupled to the interior surface of the chassis adjacent the circular area of the chassis.

22 Claims, 8 Drawing Sheets

(51) Int. Cl.
*H04R 1/20* (2006.01)
*H04R 1/32* (2006.01)
*H04R 3/00* (2006.01)
*H04R 11/04* (2006.01)
*H04R 19/00* (2006.01)
*H04M 1/00* (2006.01)
*H04M 1/03* (2006.01)
*G06F 1/18* (2006.01)
*B81B 3/00* (2006.01)
*B81C 1/00* (2006.01)
*G06F 1/16* (2006.01)
*H05K 1/11* (2006.01)
*H05K 1/18* (2006.01)

(56) References Cited

U.S. PATENT DOCUMENTS

| | | | | |
|---|---|---|---|---|
| 5,806,146 | A * | 9/1998 | Chen | H04R 1/08 24/3.1 |
| 6,093,144 | A * | 7/2000 | Jaeger | H04R 25/606 600/25 |
| 6,483,619 | B1 * | 11/2002 | Greywall | H04R 23/008 398/132 |
| 6,757,399 | B1 * | 6/2004 | Cheng | H04R 1/083 381/174 |
| 8,463,334 | B2 * | 6/2013 | Oliveira | H04M 1/03 455/575.1 |
| 9,641,922 | B2 * | 5/2017 | Slotte | H04R 1/02 |
| 9,813,802 | B2 * | 11/2017 | Shi | H04R 1/20 |
| 10,057,670 | B2 * | 8/2018 | Slotte | H04R 1/02 |
| 10,085,086 | B2 * | 9/2018 | Shi | H04R 1/20 |
| 2003/0114201 | A1 * | 6/2003 | Chung | H04M 1/05 455/575.2 |
| 2005/0207605 | A1 * | 9/2005 | Dehe | H04R 19/04 381/369 |
| 2005/0220448 | A1 * | 10/2005 | Tei | H04R 1/028 396/25 |
| 2006/0093171 | A1 * | 5/2006 | Zhe | H04R 31/003 381/191 |
| 2007/0058825 | A1 * | 3/2007 | Suzuki | H04R 19/04 381/174 |
| 2007/0201710 | A1 * | 8/2007 | Suzuki | H04R 31/006 381/174 |
| 2007/0286438 | A1 * | 12/2007 | Hirade | H04R 19/005 381/174 |
| 2008/0080729 | A1 * | 4/2008 | Izuchi | H04R 19/016 381/191 |
| 2008/0219482 | A1 * | 9/2008 | Sato | H04R 19/04 381/174 |
| 2009/0091879 | A1 * | 4/2009 | Lim | B23K 26/389 361/679.01 |
| 2009/0103704 | A1 * | 4/2009 | Kitada | H04R 9/06 379/167.14 |
| 2009/0141459 | A1 * | 6/2009 | Weber | H05K 5/0243 361/728 |
| 2009/0154752 | A1 * | 6/2009 | Chan | H04R 19/04 381/355 |
| 2010/0044808 | A1 * | 2/2010 | Dekker | B81C 1/00047 257/415 |
| 2010/0054493 | A1 * | 3/2010 | Lin | H04R 1/1041 381/74 |
| 2010/0212432 | A1 * | 8/2010 | Kasai | H04R 19/005 73/654 |
| 2011/0170730 | A1 * | 7/2011 | Zhu | H04R 1/1016 381/380 |
| 2011/0272769 | A1 * | 11/2011 | Song | H04R 31/00 257/416 |
| 2012/0069165 | A1 * | 3/2012 | Choi | H04N 1/00413 348/61 |
| 2013/0070942 | A1 * | 3/2013 | Kasai | H04R 3/00 381/162 |
| 2013/0216084 | A1 * | 8/2013 | Akino | H04R 1/342 381/346 |
| 2013/0285173 | A1 * | 10/2013 | Reimann | H04R 19/04 257/416 |
| 2014/0084396 | A1 * | 3/2014 | Jenkins | B81B 3/0021 257/419 |
| 2015/0003640 | A1 * | 1/2015 | Akino | H04R 9/08 381/162 |
| 2015/0036285 | A1 * | 2/2015 | Lu | G06F 1/1633 361/679.46 |
| 2015/0036286 | A1 * | 2/2015 | Lu | G06F 1/203 361/679.46 |
| 2015/0104048 | A1 * | 4/2015 | Uchida | G01H 11/00 381/174 |
| 2015/0358704 | A1 * | 12/2015 | Slotte | H04R 1/04 381/332 |
| 2016/0014528 | A1 * | 1/2016 | Kasai | H04R 19/04 381/191 |
| 2016/0167946 | A1 * | 6/2016 | Jenkins | H04R 19/04 257/416 |
| 2016/0304337 | A1 * | 10/2016 | Miao | H04R 31/003 |
| 2016/0352879 | A1 * | 12/2016 | Hiramatsu | H04M 19/04 |
| 2017/0238077 | A1 * | 8/2017 | Slotte | H04R 1/086 381/359 |
| 2017/0303047 | A1 * | 10/2017 | Ikeda | H04R 1/342 |
| 2018/0184211 | A1 * | 6/2018 | Kasai | H04R 7/16 |
| 2018/0255403 | A1 * | 9/2018 | Ikeda | H04R 1/2869 |
| 2018/0279031 | A1 * | 9/2018 | Ding | H04R 1/083 |
| 2018/0315409 | A1 * | 11/2018 | Matsuo | H04R 1/086 |
| 2018/0352339 | A1 * | 12/2018 | Piechocinski | B81B 3/0086 |
| 2018/0367905 | A1 * | 12/2018 | Meng | H04R 7/04 |
| 2020/0169818 | A1 * | 5/2020 | Rombach | B81B 7/0061 |

OTHER PUBLICATIONS

CTS Cincinnati Test System, "Flow to Establish an Acceptable Leak Rate," Application Bulletin 3120, Oct. 2014, 7 pages.
Flowserve, "The Connection Bulletin for a Treatise on Leakage," Vogt Valves Bulletin, 2003, 19 pages.
Knowles Acoustics "SiSonic Design Guide REV 3.0," Application Note AN16, 2011, 30 pages.
Knowles Acoustics "SiSonic Design Guide," Application Note AN24, 2017, 35 pages.

* cited by examiner

METHODS AND APPARATUS TO IMPLEMENT MICROPHONES IN THIN FORM FACTOR ELECTRONIC DEVICES

FIELD OF THE DISCLOSURE

This disclosure relates generally to electronic devices and, more particularly, to methods and apparatus to implement microphones in thin form factor electronic devices.

BACKGROUND

Many existing electronic devices include one or more microphones to detect sounds in a surrounding environment. In some instances, the location and/or placement of such microphones within an electronic device is constrained by the size and/or positioning of other components in the electronic device and/or by the overall form factor desired for the electronic device.

Figure 1:
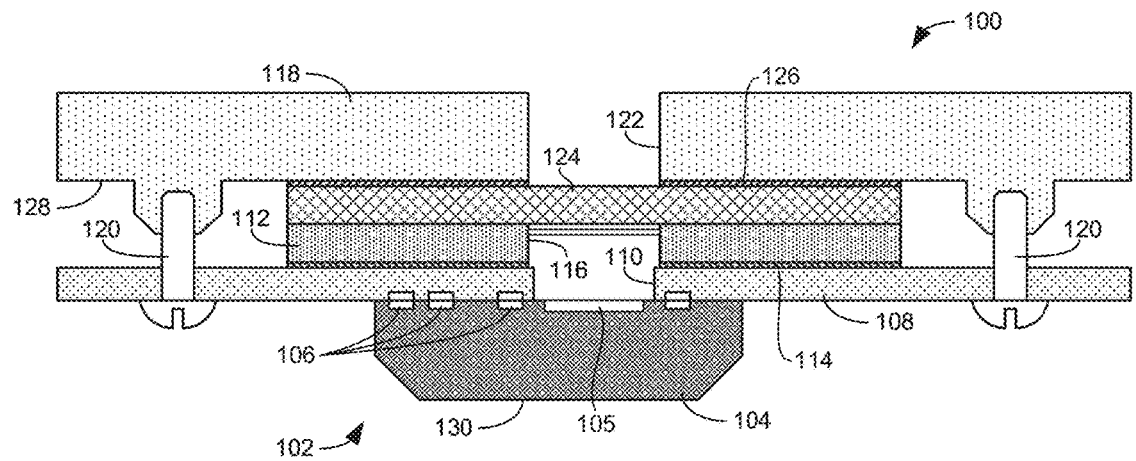
FIG. 1 is a cross-sectional view of a portion of a known electronic device including a common microphone stack-up for a bottom ported microphone with straight ducting.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Stating that any part is in "contact" with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

More and more electronic devices are being implemented with voice assistant functionality that enables a user to control the device through voice commands. With a rise in the proliferation of voice assistant functionality, there is a need to improve the ability of microphones to capture and/or detect voice commands from users in a clear manner so that reliable voice recognition may be implemented. One way in which the ability of microphones to detect sound (e.g., a user's voice) may be improved relative to existing devices is by reconsidering the placement of the microphones in the devices.

The location and/or placement of microphones in many existing devices (whether to detect voice commands and/or for any other purpose) is determined based on a number of competing factors. One significant factor constraining the placement of a microphone is aesthetics. Typically, microphones are associated with a 1 mm hole or port defining an acoustic path for sound to pass through to reach the microphone. However, microphone holes are usually not aesthetically desirable and, therefore, microphones are often positioned so that the associated holes are in a less conspicuous location on the device. For example, laptops often include a microphone between the A cover and the B cover with the hole for the microphone located within the B cover so as to be concealed when the laptop is closed. As used herein, the A and B covers of a laptop refer to the casing, shell, or chassis of the laptop lid (containing the display screen) with the A cover being the side opposite the display screen and the B cover being on the same side as the display screen. The housing of the base of a laptop includes the C and D covers with the C cover associated with the keyboard and the D cover corresponding to the bottom surface of the laptop. Thus, the A and D covers typically for the outer clamshell when the laptop is closed.

Another significant factor affecting the placement of a microphone within an electronic device is the mechanical space needed for the microphone and associated components relative to a desired size and/or form factor for the device based on aesthetic and/or other considerations. For example, many laptops include a lid that is designed to be substantially no thicker than needed to house a display screen. As such, placing a microphone behind the display screen would add undesirable thickness to the lid (not to mention such a placement would undesirably result in a hole on the A cover as discussed above). Accordingly, microphones are often placed adjacent the display screen within the bezel surrounding the screen.

Another factor affecting microphone placement includes the expected position and/or orientation of the device relative to a source of sound to be detected by the microphone. For example, in situations where voice commands are to be detected from nearby people regardless of their position relative to the device, one or more microphones needs to be suitably placed to detect sounds from many directions (e.g., 360 degrees). Further, in some instances, it may be desirable to place microphones that can detect sound regardless of whether the laptop lid is opened or closed. In such situations, a microphone associated with a hole in the B cover may be insufficient because the hole would be substantially obstructed when the laptop lid is closed.

Other factors affecting microphone placement include the effect of fan noise and/or speaker playback on the microphone. Another factor includes the proximity of the microphone to an antenna in the electronic device. Another factor includes the ability to protect the microphone from water splash and/or being affected by dust. Often, water splash protection is provided by a filter placed between the microphone and the hole in the device housing or chassis through which sound is to pass. While such a filter can reduce concerns for water or dust affecting the microphone, the filter adds to the z-height of the microphone stack-up thereby creating concerns for the mechanical space needed to provide sufficient room for the microphone as discussed above.

Examples disclosed herein overcome some of the challenges and tradeoffs described above in connection with the placement of microphones. More particularly, instead of implementing a 1 mm hole for a microphone as is commonly done in many existing devices, examples disclosed herein include a plurality of much smaller holes (e.g., less than 0.2 mm). These small holes are distributed within a circular area having a diameter of 1 mm. In some examples, the holes are approximately 0.1 mm in diameter. As used herein, the term "approximately" used with reference to the diameter of holes means within +/−0.05 mm. Thus, in some examples, the holes range from 0.05 mm and 0.15 mm in diameter. Holes that are approximately 0.1 mm are not easily visible to a human without the aid of a microscope, magnifying glass, or other vision enhancing device. As such, the placement of microphones in accordance with teachings disclosed herein are not limited by aesthetic concerns based on the appearance of a microphone hole. Furthermore, holes that are approximately 0.1 mm are sufficiently small that water splashed onto such holes will not leak through the holes because of the surface tension of the water. As a result, there is no need for a filter to be included in the microphone stack-up, thereby reducing the space required for the microphone.

In some examples, the z-height of the microphone stack-up is further reduced by eliminating the flexible printed circuit or printed circuit board on which a microphone is typically mounted in many existing electronic devices. Instead, in some examples, the electrical circuitry (e.g., electronic traces and contact pads) to which a microphone is electrical coupled are embedded into the casing or chassis containing the small plurality of holes with the microphone directly attached (soldered) to the chassis. Eliminating the components commonly included in a microphone stack-up and using a plurality of small holes as disclosed herein opens up many more possibilities in the placement of a microphone not previously possible based on typical design constraints.

FIG. 1 is a cross-sectional view of a portion of a known electronic device 100 including a common microphone stack-up 102 for a bottom ported microphone 104 with straight ducting. A bottom ported microphone is a microphone with an acoustic port 105 in the bottom of the microphone package (e.g., on the same side as solder pads 106 of the microphone 104). Thus, as shown in FIG. 1, the microphone 104 is soldered to a flexible printed circuit (FPC) 108 (sometimes referred to as a flex circuit) that includes a hole 110 aligned with the acoustic port 105 of the microphone 104. The FPC includes electronic traces that electrically couple the microphone to other components associated with the device 100.

Surrounding the hole 110 in the FPC 108 on the side opposite to the microphone 104 is a gasket 112, which may be affixed to the FPC 108 with an adhesive 114. The gasket 112 also includes a hole or opening 116 aligned with the hole 110 of the FPC 108. The gasket serves to reduce acoustic leakage as sound travels toward the microphone 104. As shown in FIG. 1, the FPC 108 is attached to a casing or chassis 118 of the electronic device 100 via fasteners 120 so that the holes 110, 116 in the FPC 108 and gasket 112 align with a microphone port or hole 122 in the chassis 118. The hole 122 in the chassis 118 has a diameter of approximately 1 mm. The holes 110, 116, 122 in the FPC 108, the gasket 112, and the chassis 118 are aligned to define the ducting that provides an acoustic path for sound to pass through from an exterior environment to the microphone 104.

As shown in FIG. 1, an acoustic filter 124 is positioned between the gasket 112 and the chassis 118 to extend across the acoustic path to prevent dust and/or water splash from reaching the microphone 104 while still allowing sound to pass through. The filter 124 may be affixed to the chassis 118 via an adhesive 126. The gasket 112 may be held against the filter 124 by compressive forces generated by the fasteners 120.

A typical thickness of the filter 124 is about 0.2 mm. A typical thickness of the gasket 112 is about 0.3 mm. A typical thickness of the FPC 108 (with a stiffener) is about 0.2 mm. A typical thickness of the microphone 104 is about 0.95 mm. As a result, the total thickness of the microphone stack-up 102 of FIG. 1 between the inner or interior surface 128 of the chassis 118 and a distal surface 130 of the microphone 104 (e.g., the surface farthest away from the chassis 118) is about 1.65 mm. Although other arrangements are possible (e.g., for a top-ported microphone), most microphone stack-ups include similar elements with similar thicknesses as those shown in FIG. 1. Such arrangements with an overall thickness of approximately 1.7 mm (excluding the chassis 118) is too thick to fit under the A cover of many known laptops or in the thin bezel designs for laptop lids less than 4 mm thick.

Figure 2:
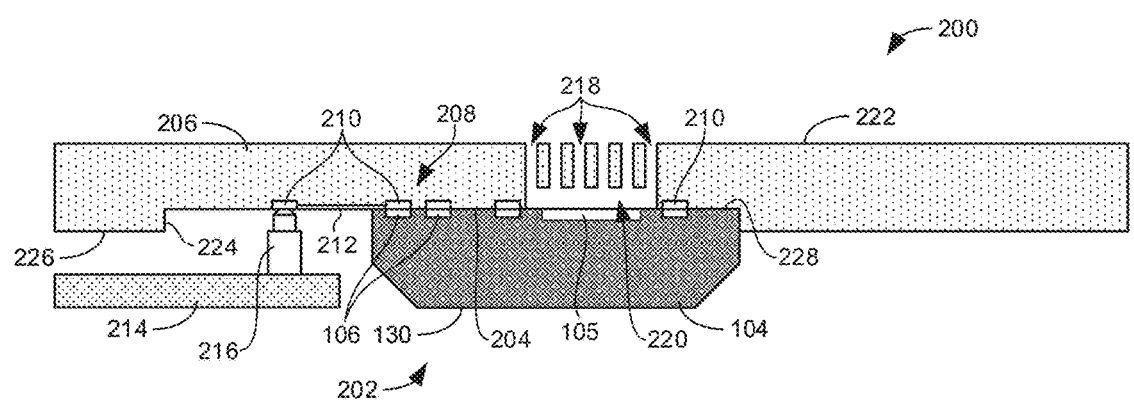
FIG. 2 is a cross-sectional view of a portion of an example electronic device including an example microphone stack-up constructed in accordance with teachings disclosed herein.

FIG. 2 is a cross-sectional view of a portion of an example electronic device 200 including an example microphone stack-up 202 constructed in accordance with teachings disclosed herein. For purposes of comparison, the microphone stack-up 202 of FIG. 2 includes the same microphone 104 used in the microphone stack-up 102 of FIG. 1. As shown in the illustrated example, the microphone 104 is directly attached to an inner surface 204 of a chassis 206 of the associated device 200. More particularly, in this example, the solder pads 106 of the microphone 104 are soldered directly to an electrical circuit 208 embedded in the inner surface 204 of the chassis 206. As shown in the illustrated example, the electrical circuit 208 includes solder and/or contact pads 210 and associated electronic traces 212. In some examples, the electrical circuit 208 is formed on the chassis 206 following a molding process for the chassis 206. In some examples, the chassis 206 includes molded plastic and the electrical circuit 208 is formed therein through a laser direct structuring (LDS) process.

Embedding the electrical circuit 208 within the chassis 206 enables the microphone 104 to be coupled to the chassis 206 without an FPC (e.g., eliminates the FPC 108 of FIG. 1) and/or without a printed circuit board (PCB) between the microphone 104 and the chassis 206. Rather, as shown in the illustrated example of FIG. 2, an FPC 214 is inside the housing defined by the chassis 206 but spaced apart from and adjacent the microphone 104 yet in proximity with the electrical circuit 208. Further, the example FPC 214 includes a spring contact connector 216 (or any other suitable connector) to electrically connect the FPC 214 with one of the contact pads 210 of the electrical circuit 208 in the chassis 206. In this example, the FPC 214 is thereby electrically coupled to the microphone 104 via the electronic traces 212. The example FPC 214 may be physically attached to the chassis 206 and electrical coupled to (e.g., in circuit with) one or more other components (e.g., a processor, a power source, etc.) in the electronic device 200. In some examples, the FPC 214 may alternatively be implemented with a PCB.

Figure 3:
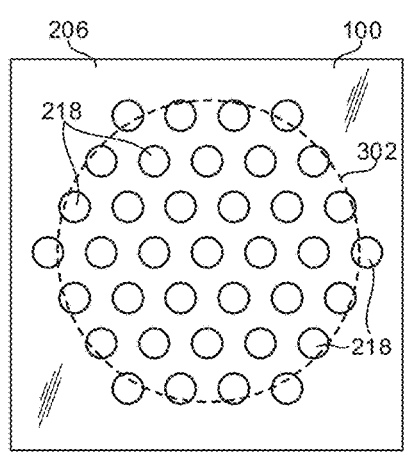
FIG. 3 is a top view of an example arrangement of the array of holes in the chassis of the electronic device of FIG. 2.

As described above, the implementation of the common microphone stack-up 102 of FIG. 1 involves aligning the microphone 104 with the microphone port or hole 122, which typically has a diameter of approximately 1 mm. By contrast, the example chassis 206 of FIG. 2 includes an array of relatively small holes 218 distributed within a circular area having a diameter of approximately 1 mm. FIG. 3 is a top view of an example arrangement 300 of the array of holes 218 in the chassis 206 of the electronic device 100 of FIG. 2 For purposes of illustration, a 1 mm circular area 302 is demarcated by dashed line with the holes 218 represented with a diameter of 0.1 mm. In some examples, as shown in FIG. 3, while the array of holes 218 are distributed within the circular area 302, some of the holes 218 may extend beyond the circular area to an area larger than 1 mm in diameter. In examples, at least some of the holes may be entirely outside the 1 mm circular area 302. In other examples, all of holes 218 may be confined to an area that is within circular area 302 or confined to an area less than 1 mm in diameter. Further, although the array of holes 218 are described as being distributed within the circular area 302, the particular arrangement of the holes 218 need not necessarily be circular but can be any suitable shape (e.g., circular, square, triangular, hexagonal, etc.). Thus, as used herein, to state that the array of holes are distributed "within a 1 mm diameter circular area" does not mean that all holes in the array are confined to or exactly aligned with the dimensions of the circular area or that the holes are arranged in a circular pattern. Rather, as used herein, references to holes being within a 1 mm diameter circular area means that the holes have a size (e.g., diameter) that is sufficiently small and are spaced in sufficient proximity to one another for multiple holes to fit within the 1 mm diameter area.

Returning to FIG. 2, in some examples, the holes 218 extend to an open area 220 at the inner surface 204 of the chassis 206 such that the length of the holes 218 is less than the full thickness of the chassis 206. The open area 220 may allow for the holes 218 to be distributed over a larger area than the acoustic port 105 on the microphone itself while still providing an unobstructed acoustic path from the holes to the acoustic port of the microphone. In some examples, the length (or depth) of the holes 218 is approximately 0.3 mm. In other examples, the length of the holes 218 may be greater or less than 0.3 mm. In some examples, the holes 218 may extend the full thickness of the chassis 206.

In some examples, the small holes 218 have a diameter of less than 0.2 mm. In some examples, the diameter of the small holes are approximately 0.1 mm (e.g., range from 0.05 mm to 0.15 mm). In some examples, the diameter of the small holes is no greater than 0.1 mm. Further, in some examples, the small holes 218 are positioned in a relatively dense arrangement. For example, adjacent holes 218 may be positioned with a distance between their centers being no more than 3 times the diameter of the holes (e.g., 0.3 mm) or less (e.g., only twice their diameter or even less). The compact arrangement of the holes 218 enables the combined area of opening of all the holes to provide an adequate acoustic path for sound to travel to the microphone. In some examples, the combined area of opening of the holes 218 corresponds to the area of a circle of at least 0.3 mm in diameter (e.g., approximately 0.071 $mm^2$). In some examples, the combined area of opening of the holes 218 may be considerably higher (e.g., between 30% and 50% of the area of a 1 mm diameter circle within which the holes are distributed (e.g., between approximately 0.236 $mm^2$ and 0.393 $mm^2$)).

As shown in the illustrated example, the electrical circuit 208 is positioned so as to be around the array of holes 218 in the chassis 206 to enable the microphone 104 to be attached to the chassis 206 in alignment with the holes 218. In this manner, the array of holes 218 define an acoustic path for sound to pass through the chassis to be sensed by the microphone 104. Further, the soldered connection between the microphone 104 and the chassis 206 provides an acoustic seal between the microphone 104 and the chassis 206. As such, the microphone 104 can be coupled to the chassis 206 without a gasket (e.g., eliminating the gasket 112 of FIG. 1) between the microphone and chassis.

In some examples, the diameter of the holes 218 are sufficiently small to be substantially imperceptible to the unaided eye of a human. As a result, there is less concern of affecting the aesthetic appearance of the device 200 relative to a visible 1 mm hole commonly used in known microphone arrangements. That is, in accordance with teachings disclosed herein, the placement of the microphone 104 is not limited to discrete locations and/or locations that align with other features of the device (e.g., other holes associated with different microphones). That is, for many known electronic devices, when a microphone hole cannot be hidden, the hole is placed in a position that is at least geometrically aligned with other holes and/or other visible features on a device. By contrast, the holes 218 of the illustrated example may be placed at any location where the microphone 104 would fit regardless of whether such a location is aligned with visible features of the associated device 200.

Furthermore, the diameter of the holes 218 are sufficiently small to substantially reduce the likelihood of water splashed on an exterior surface 222 of the chassis 206 from leaking through to the microphone 104. More particularly, it is expected that a 0.1 mm hole can withstand being submerged under approximately 25 cm of water. In some examples, the surface of the holes 218 may be treated with a hydrophobic material to further reduce the likelihood of water passing through the holes due to the surface tension of the water. The small diameter of the holes 218 also blocks dust and other particles that are greater in size than the diameter of the holes 218 (e.g., greater 0.1 mm). The ability of the holes 218 to protect the microphone 104 from water splash and dust eliminates the need for a filter (e.g., eliminating the filter 124 of FIG. 1). Thus, as shown in the illustrated example, the microphone 104 may be coupled to the chassis 206 without a filter between the microphone and chassis.

Additionally, the smaller diameter holes (relative to traditional microphone holes) may reduce surface turbulence and the associated wind noise that may be detected by the microphone.

As described above and shown in the illustrated example of FIG. 2, the microphone 104 may be coupled to the chassis 206 without any of a filter, a gasket, an FPC, or a PCB positioned therebetween. This significantly reduces the total z-height of the microphone stack-up 202 of FIG. 2 relative to the height of the microphone stack-up 102 of FIG. 1. This reduced z-height enables the microphone to be placed at locations not previously possible when limited to specified form factors for an associated electronic device. As mentioned above, the combined thickness of the FPC 108, the gasket 112, and the filter 124 of FIG. 1 is approximately 0.7 mm. Therefore, the total distance between the inner surface 204 of the chassis 206 on which the microphone 104 is mounted and the distal surface 130 of the microphone 104 is 0.7 mm less in FIG. 2 than in FIG. 1. In other words, in the illustrated example of FIG. 2, the distance between the inner surface 204 of the chassis 206 and the distal surface 130 of the microphone 104 approximately corresponds to the thickness of the microphone (e.g., 0.95 in this example).

In some examples, the inner surface 204, to which the microphone 104 is attached, corresponds to a recess 224 that is inset from a main interior surface 226 of the chassis 206. The depth of the recess results in a further reduction of the distance between the main interior surface 226 and the distal surface 130 of the microphone 104 to less than the thickness of the microphone 104. In some examples, the distance between the main interior surface 226 of the chassis 206 and the distal surface 130 of the microphone 104 is less than 0.6 mm.

Another advantage of eliminating the filter, gasket, and FPC from being positioned between the microphone 104 and the chassis 206 is that these elements shorten the total microphone duct length corresponding to the distance between the exterior surface 222 of the chassis 206 and a proximal surface 228 of the microphone 104 (e.g., the surface closest to the chassis 206). More particularly, in some examples, the total microphone duct length corresponds to the thickness of the chassis 206, which may be less than 1 mm. Such a short duct length for the microphone provides an improved (e.g., higher) frequency response relative to other microphone arrangements with a longer duct. Further, the shortened duct length may reduce audible frequency Helmholtz resonances.

Figure 4:
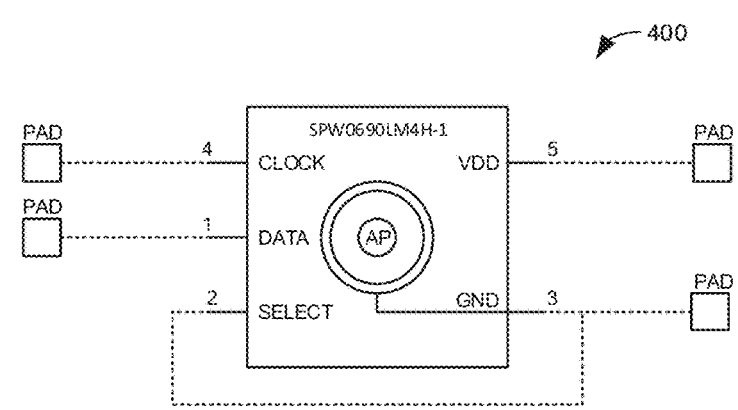
FIG. 4 illustrates an example microphone circuit that may be implemented in the example microphone stack-up of FIG. 2.
Figure 5:
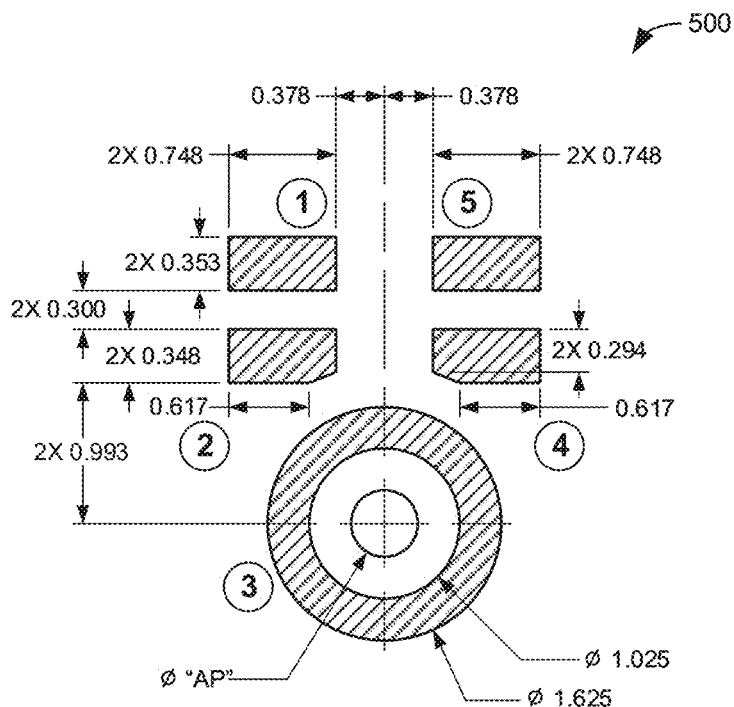
FIG. 5 illustrates an example PCB footprint for the microphone circuit shown in FIG. 4.
Figure 6:
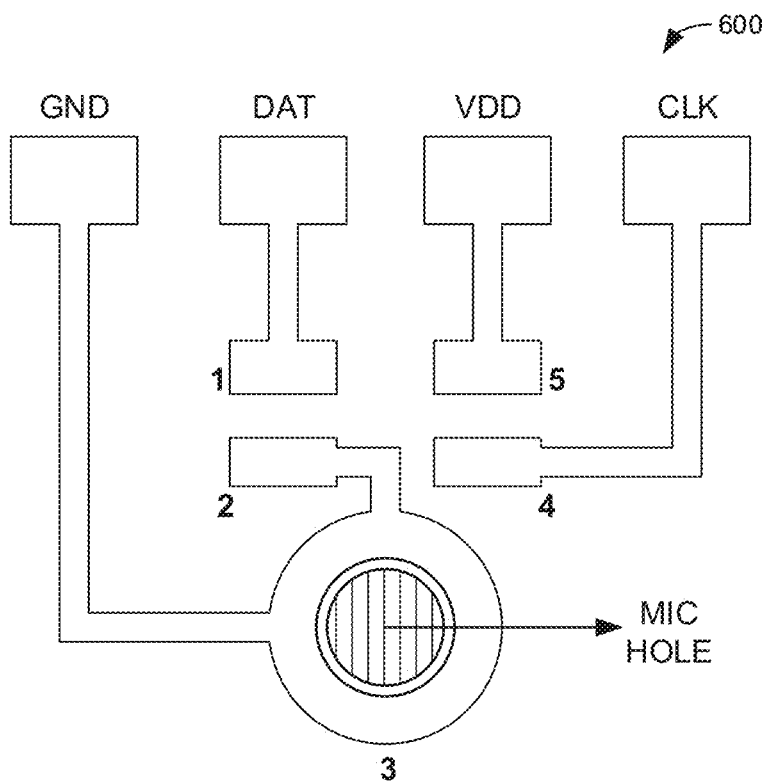
FIG. 6 illustrates an example laser direct structuring pattern for the example electrical circuit of FIG. 2 that corresponds to the PCB footprint shown in FIG. 5.

FIG. 4 illustrates an example microphone circuit 400 that may be implemented in the example microphone stack-up 202 of FIG. 2. As shown in the illustrated example, there are five inputs and/or outputs connected to four different contact pads to be electrically coupled to other components in an electronic device (e.g., the device 200 of FIG. 2). However, rather than connecting the contact pads to an FPC or PCB, in some examples, the contact pads of the microphone are connected to the electrical circuit 208 that is molded into the chassis 206 of the electronic device 200. FIG. 5 illustrates an example PCB footprint 500 for the microphone shown in FIG. 4. FIG. 6 illustrates an example laser direct structuring (LDS) pattern 600 for the electrical circuit 208 that may be formed on the inner surface 204 of the chassis 206 that corresponds to the PCB footprint shown in FIG. 5.

Figure 7:
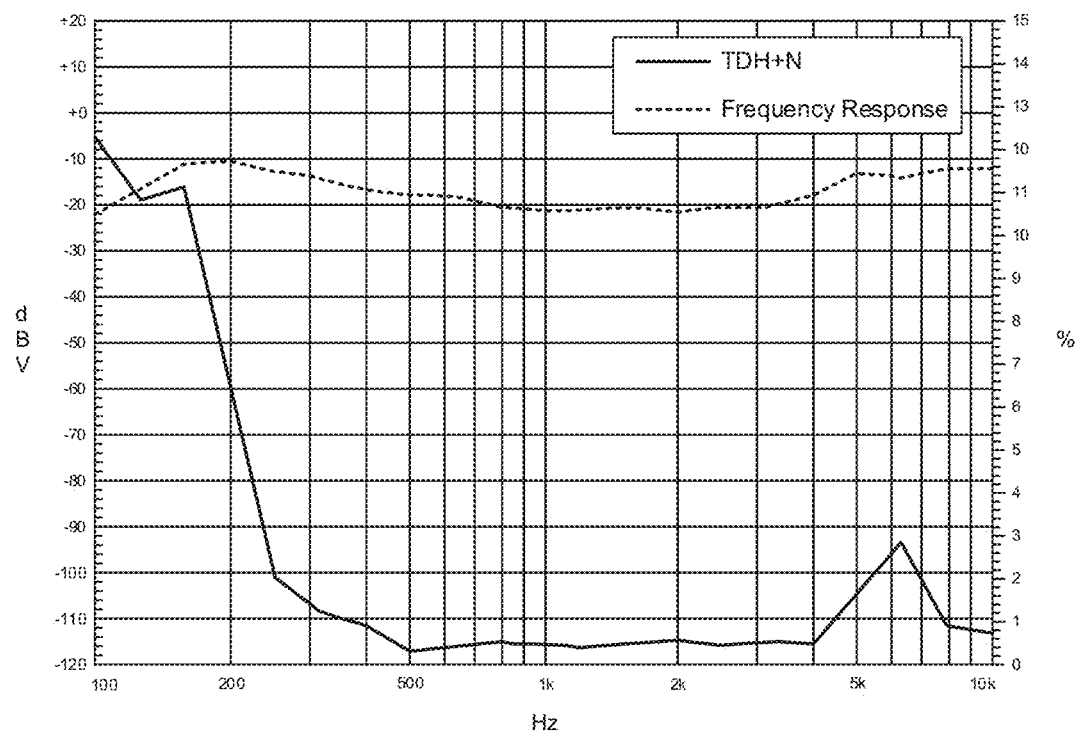
FIGS. 7-9 are graphs representing test results demonstrating the viability of the examples disclosed herein.
Figure 8:
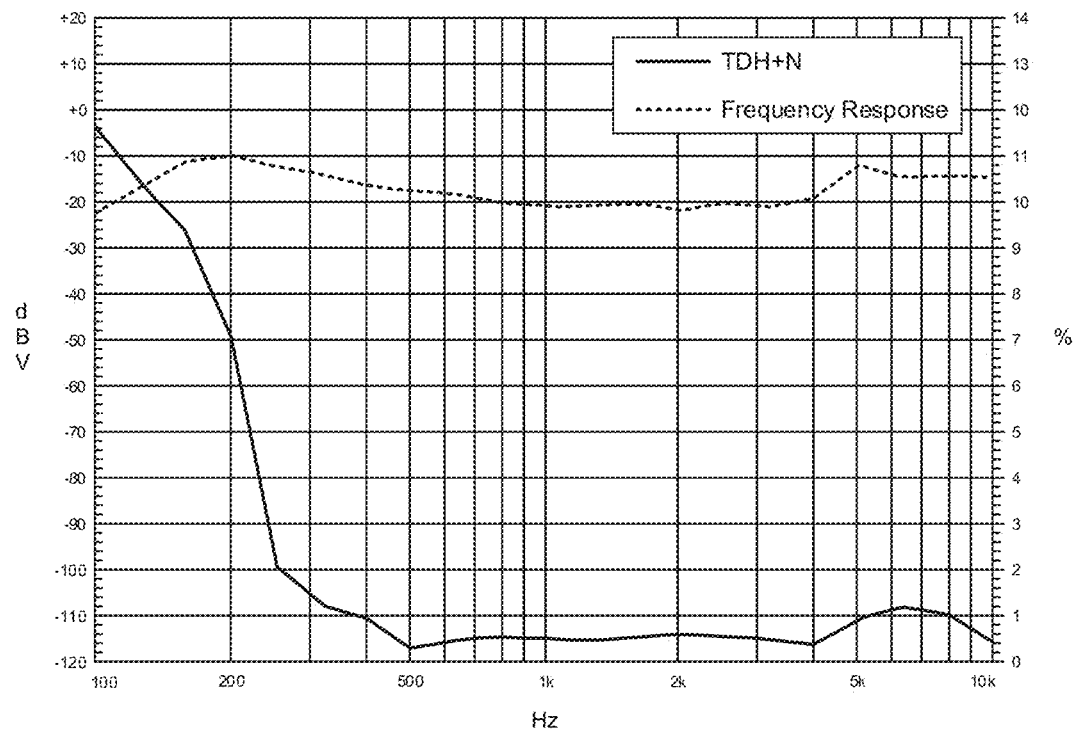
Figure 9:
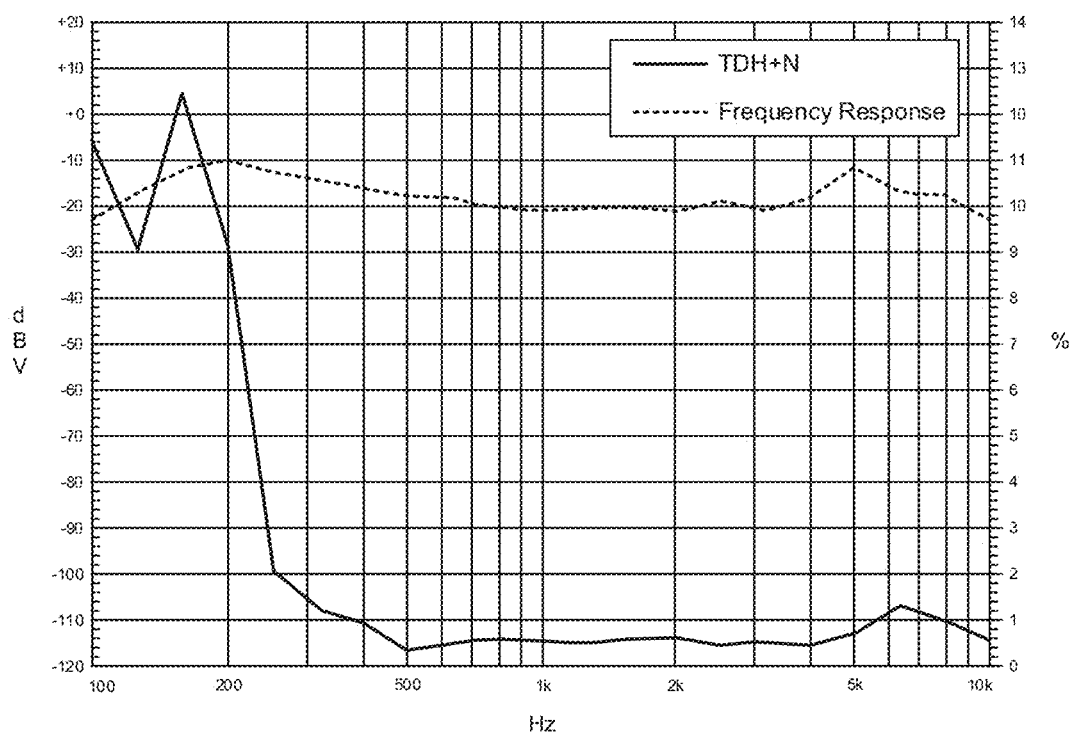
Figure 10:
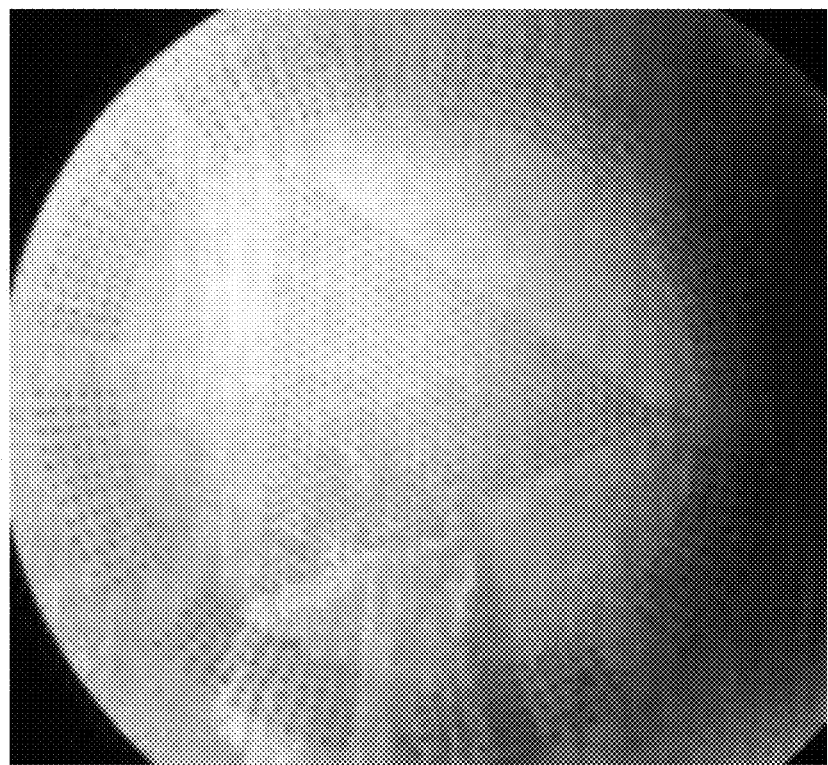
FIG. 10 is an image of an example test sample showing an arrangement of small holes used to generate the results in the graphs of FIGS. 7-9.

FIGS. 7-9 are graphs representing test results demonstrating the viability of the examples disclosed herein. In particular, a 0.3 mm thick aluminum test sample was created with small holes (having a diameter of 0.1 mm) micro drilled through the test sample. For purposes of experimentation, the holes were drilled in a pattern spread over an 8 mm circular area shown in FIG. 10. The image shown in FIG. 10 was taken with a microscope as the holes were not visible to the naked eye. As shown in each of the graphs of FIGS. 7-9, the total harmonic distortion plus noise (THD+N) and the frequency response of a microphone on a laptop computer was tested under different circumstances. More particularly, FIG. 7 represents the test results for the microphone without the test sample in place. Thus, the results in FIG. 7 provide a baseline of comparison for when the test sample was used in FIGS. 8 and 9. FIG. 8 represents the test results when the test sample (FIG. 10) is stuck over the microphone port using acoustic putty. FIG. 9 represents the test results with a 1 mm thick plastic sheet stuck on top of the test sample (FIG. 10) with a 1 mm hole in the plastic sheet aligned with the microphone port of the laptop computer.

All of the tests were performed in a 250 Hz rated full anechoic chamber. As such, the results below 250 Hz can be disregarded. As can be seen by a comparison of the graphs in FIGS. 7-9, there is relatively little difference in the THD+N or the frequency response when sound passes through the micro holes (FIGS. 8 and 9) relative to the baseline test when no test sample was covering the microphone (FIG. 6).

Figure 11:
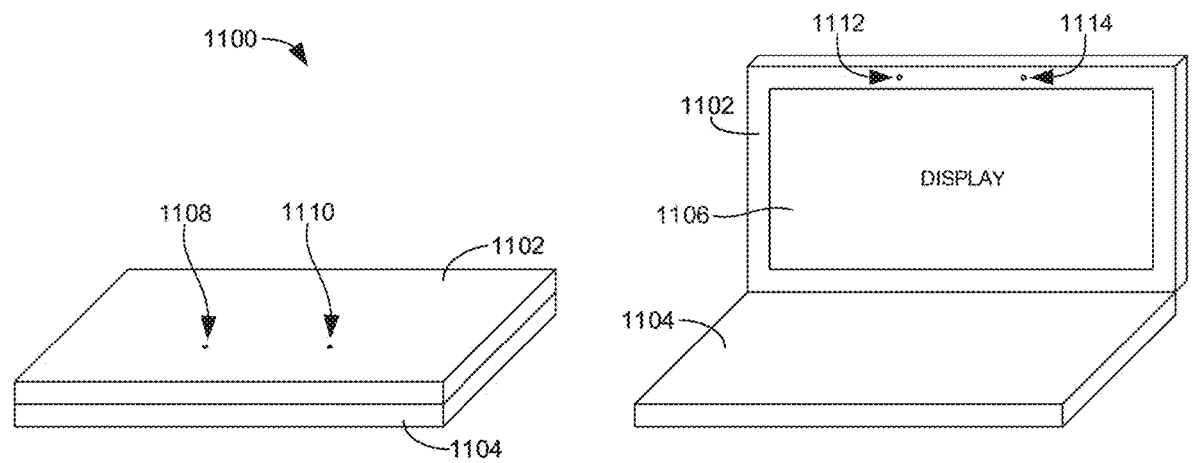
FIG. 11 illustrates an example laptop constructed in accordance with teachings disclosed herein.

FIG. 11 illustrates an example laptop 1100 constructed in accordance with teachings disclosed herein. In the illustrated example, the laptop 1100 includes a lid 1102 that is rotatably coupled to a base 1104 to move between an opened (right image in FIG. 11) and closed (left image in FIG. 11) position. In this example, the lid 1102 includes a display screen 1106 and four separate microphones positioned at locations represented by four microphone ports 1108, 1110, 1112, 1114 identified in the illustrate example. More particularly, two of the microphone ports 1108, 1110 pass through the A cover of the lid 1102 (e.g., the backside of the lid) and the other two microphone ports 1112, 1114 pass through the B cover (e.g., through the bezel surrounding the display screen 1106).

Figure 12:
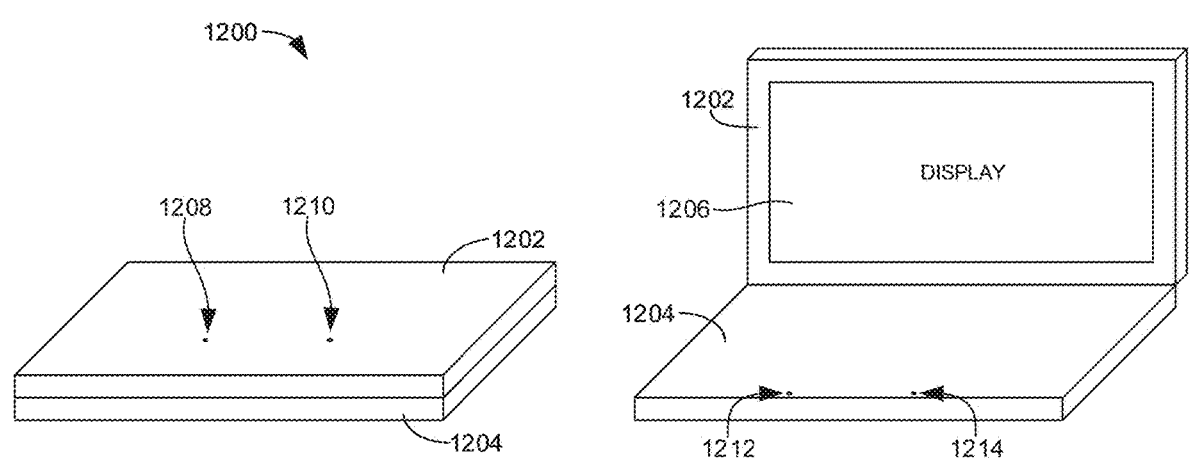
FIG. 12 illustrates another example laptop constructed in accordance with teachings disclosed herein.

FIG. 12 illustrates another example laptop 1200 constructed in accordance with teachings disclosed herein. The laptop 1200 of FIG. 12 is similar to the laptop 1100 of FIG. 11 with a lid 1202 (containing a display screen 1206) that is rotatably coupled to a base 1204. Further, similar to FIG. 11, the example laptop 1200 of FIG. 12 includes four microphones located by the four microphone ports 1208, 1210, 1212, 1214 identified in the illustrate example. However, unlike the laptop 1100 in FIG. 11, only two of the microphones are located in the lid 1202, while the other two microphones are located in the base 1204. More particularly, as shown in the illustrated example of FIG. 12, the two microphones in the lid 1202 are positioned to sense sound through the microphone ports 1208, 1210 that pass through the A cover of the lid 1202 and the two microphones in the base 1204 are positioned to sense sound through the microphone ports 1212, 1214 that pass through the C cover (e.g., top side of the base).

The placement of the microphones in the illustrated example of FIGS. 11 and 12 enable a uniform 360 degree far-field voice pick up, irrespective of the lid position. Such a placement is not done in existing laptops because the standard 1 mm diameter holes used for standard microphone arrangements is undesirable in the A cover because it detracts from the aesthetic appeal of the device. However, in accordance with teachings disclosed herein, the microphone ports 1108, 1110, 1112, 1114, 1208, 1210, 1212, 1214 are not easily visible to the naked eye (if visible at all) because they are implemented using a plurality of smalls holes (e.g., the small holes 218 of FIG. 2) distributed within an area (e.g., a circular area) corresponding to a standard microphone port used in existing electronic devices (e.g., a circular area having a diameter of 1 mm). Thus, the microphone ports are visibly shown in FIGS. 11 and 12 for purposes of explanation only. As such, there is no limitation in where the microphone ports can be placed as far as aesthetic considerations are concerned. Indeed, although the microphone ports in the illustrated examples are shown as being substantially aligned with and centered relative to the edges of the laptop, this placement is not necessary. Rather, the microphones could be misaligned and/or off-centered (as appropriate based on other design constraints) without detracting from the aesthetics of the device because the microphone ports are not visible.

Independent of aesthetic concerns associated with the appearance of microphone holes, existing laptops do not include microphones in the lid that open through the A cover as shown in the illustrated examples because there is not sufficient space to fit the microphone stack-up. That is, many laptops include relatively thin lids that are not much thicker than the display screen housed therein such that there is no room for a microphone to be positioned behind the display. However, with the significantly reduced z-height of the example microphone stack-ups disclosed herein, fitting a microphone behind a display screen is much easier to do. A specific example implementation of a microphone in the lid of a laptop is shown and described in connection with FIGS. 13 and 14.

Figure 13:
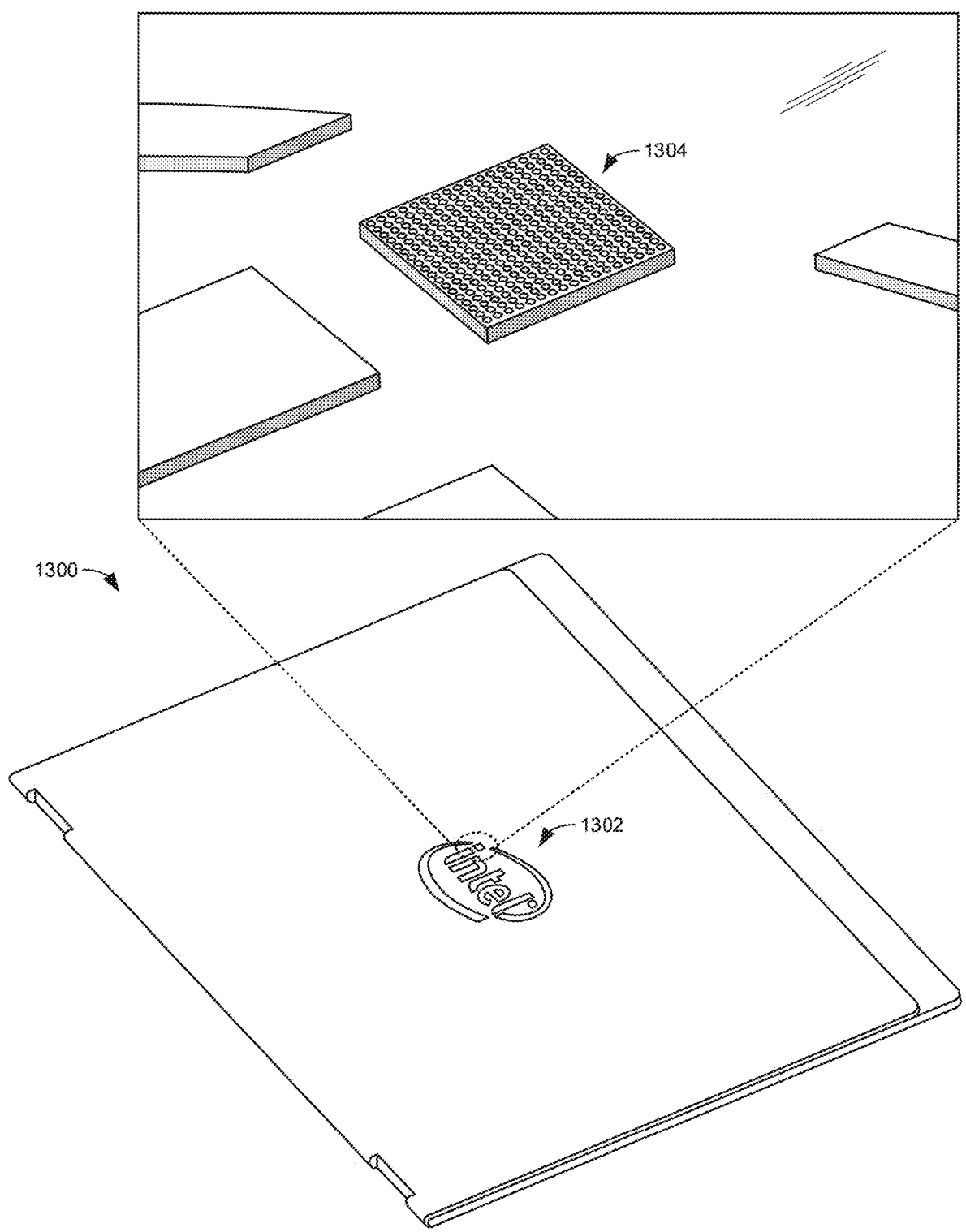
FIG. 13 illustrates an example laptop lid with an enlarged view of a portion of a company logo on the A cover of the lid.

FIG. 13 illustrates an example laptop lid 1300 with an enlarged view of a portion of a company logo 1302 on the A cover (e.g., the side opposite the display screen). As shown in the enlarged view of the illustrated example, an array of holes 1304 having a 0.1 mm diameter are incorporated into a portion of the logo 1302. More particularly, in this example, the array of holes 1304 are distributed across the dot of the letter "i." In the illustrated example, the array of holes 1304 substantially cover the entire area of the dot. However, in other examples, only a portion of the dot may include the holes 1304 so long as the holes 1304 are distributed sufficiently to provide adequate ducting for an acoustic path for sound to travel to a microphone below the A cover. That is, in some examples, the holes 1304 are distributed across a circular area of about 1 mm in diameter and are densely positioned relative to one another to provide a combined area of opening corresponding to the area of a circular region of at least 0.3 mm in diameter.

In the illustrated example of FIG. 13, the holes 1304 are arranged in a square lattice type array with the holes 1304 aligned in perpendicular rows and columns. In other examples, the holes 1304 may be arranged in any other suitable manner such as, for example, a hexagonal lattice type array to provide a honeycomb structure (e.g., as shown in the illustrated example of FIG. 3. In some examples, the holes 1304 may be positioned in a different part of the logo 1302. Additionally or alternatively, in some examples, the holes 1304 may be positioned on the main surface of the A cover between different portions of the logo 1302 (e.g., in the space between the dot and the line of the letter "i").

Figure 14:
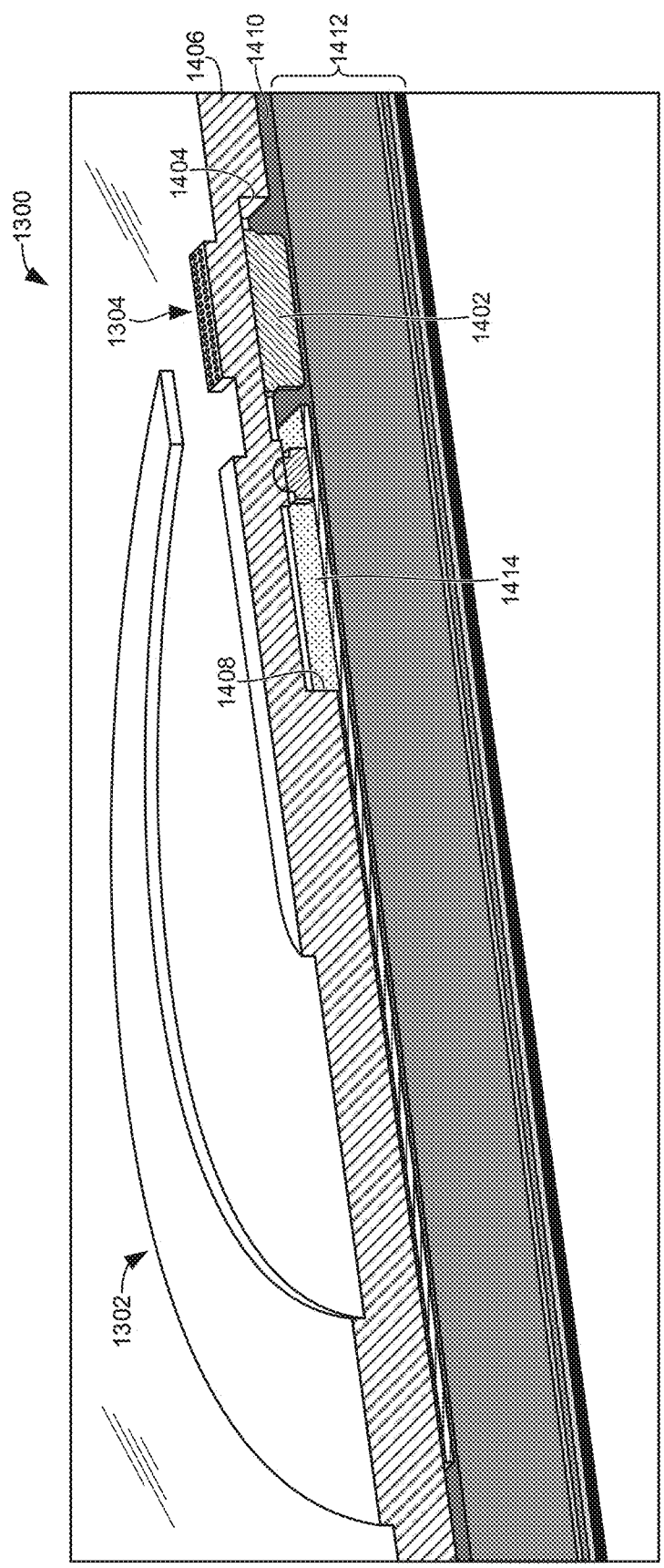
FIG. 14 is a cutaway view of the example lid of FIG. 13 extending through the company logo.

FIG. 14 is a cutaway view of the example lid 1300 of FIG. 13 cut along a plane extending through "i" in the logo 1302 of FIG. 13. As shown in the illustrated example, the array of holes 1304 are positioned in alignment with a microphone 1402 attached (e.g., via soldering) to an inner surface 1404 of the chassis 1406 corresponding to the A cover of the lid 1300. As shown in the illustrated example, the inner surface 1404 is within a recess 1408 such that the inner surface 1404 is inset relative to a main interior surface 1410 of the chassis 1406. In this example, the inner surface 1404 is inset relative to the main interior surface 1410 such that the microphone 1402 extends below the main interior surface 1410 of the chassis 1406 by approximately 0.55 mm. As a result, the microphone can be placed behind the display screen (and associated components) 1412 without adding appreciable thickness to the lid 1300. Inasmuch, as the microphone 1402 is located in the lid 1300, which does not include fans or speakers, the amount of vibrations resonating through the chassis 1406 are expected to be relatively minimal. However, in some examples, one or more dampeners may be positioned around the microphone to reduce the effects of chassis resonances.

As described above, the relatively small z-height for the microphone stack-up is achieved, in part, due to the small holes 1304 fulfilling the purpose of a filter so that a filter does not need to be positioned between the microphone 1402 and the chassis 1406. Further, the relatively small z-height is achieved by embedding an electrical circuit within the inner surface 1404 of the chassis 1406 on to which the microphone 1402 is soldered. Directly soldering the microphone 1402 to the chassis 1406 in this manner provides an acoustic seal between the microphone 1402 and chassis 1406, thereby eliminating the need for a gasket to be positioned between the microphone 1402 and chassis 1406. Further still, the electrical circuit in the chassis 1406 enables an FPC 1414 (or a PCB) to be electrically coupled to the microphone 1402 while being spaced apart from and adjacent to the microphone 1402. As a result, the FPC 1414 does not need to be included in the microphone stack-up, thereby further reducing the z-height of the microphone stack-up.

Figure 15:
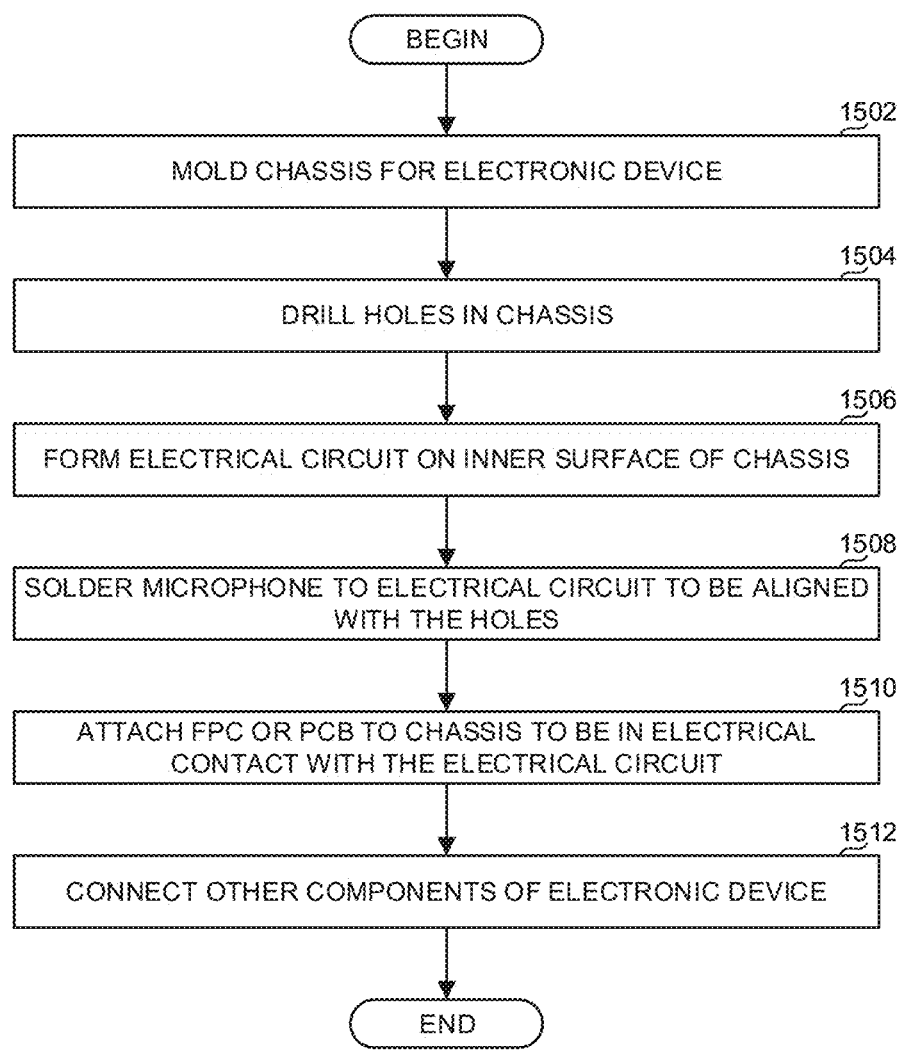
FIG. 15 is a flowchart representative of an example manufacturing process to construct any one of the example electronic devices disclosed herein.

FIG. 15 is a flowchart representative of an example manufacturing process to construct any one of the example electronic devices (e.g., the electronic device 200 of FIG. 2, the example laptops 1100, 1200 of FIGS. 11 and 12, or the laptop lid 1300 of FIGS. 13 and 14). The example process begins at block 1502 by molding a chassis (e.g., the chassis 206 of FIG. 2 or the chassis 1406 of FIG. 14) for the electronic device. At block 1504, holes (e.g., the holes 218 of FIG. 2 or the holes 1304 of FIGS. 13 and 14) are drilled into the chassis. As described above, the holes have a relatively small diameter (e.g., 0.1 mm). Accordingly, in some examples, the holes are drilled using a laser.

At block 1506, an electrical circuit (e.g., the electrical circuit 208 of FIG. 2) is formed on an inner surface of the chassis. In some examples, the electrical circuit is formed using a laser direct structuring (LDS) process. The electrical circuit is formed in the chassis so as to align with the location of the holes. As a result, at block 1508, a microphone (e.g., the microphone 104 of FIG. 2 or the microphone 1402 of FIG. 14) is soldered to the electrical circuit to be aligned with the holes.

At block 1512, an FPC or a PCB is attached to the chassis to be in electrical contact with the electrical circuit. In this manner, the FPC or PCB is electrically coupled to the microphone. At block 1514, other components of the electronic device are connected. The types of components that are connected may depend on the nature of the electronic device being manufactured. In the illustrated example of FIG. 14, the other components include the display screen 1412 and other components of a laptop. Thereafter, the example process of FIG. 15 ends. Although the example process is described with reference to the flowchart illustrated in FIG. 15, many other methods of manufacturing the example electronic devices 200, 1100, 1200, 1300 may alternatively be used. For example, the order of execution of the blocks may be changed, and/or some of the blocks described may be changed, eliminated, or combined.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

From the foregoing, it will be appreciated that example methods, apparatus and articles of manufacture have been disclosed that enable one or more microphones to be placed in nonconventional locations within an electronic device by reducing the total z-height of the microphone stack (thereby enabling the microphone to fit in thinner form factors) and by creating microphone ports with a plurality of small holes that are not readily visible to the naked eye (thereby enabling the microphone to be placed in any suitable location without concerns regarding the aesthetics of the electronic device).

Example methods, apparatus, systems, and articles of manufacture to implement microphones in thin form factor electronic devices are disclosed herein. Further examples and combinations thereof include the following:

Example 1 includes an electronic device comprising a chassis having an exterior surface and an interior surface, the chassis including a plurality of holes extending through the chassis, the plurality of holes within a 1 mm diameter circular area of the chassis, and a microphone coupled to the interior surface of the chassis adjacent the circular area of the chassis.

Example 2 includes the electronic device of example 1, wherein at least one of the plurality of holes has a diameter of approximately 0.1 mm.

Example 3 includes the electronic device of any one of examples 1 or 2, wherein a distance between centers of different ones of the plurality of holes is less than 0.3 mm.

Example 4 includes the electronic device of any one of examples 1-3, wherein a combined area of the openings associated with the plurality of holes corresponds to at least 30% of the circular area.

Example 5 includes the electronic device of any one of examples 1-4, wherein the microphone is coupled to the chassis without a filter between the microphone and the circular area of the chassis.

Example 6 includes the electronic device of any one of examples 1-5, wherein the microphone is coupled to the chassis without a gasket between the microphone and the circular area of the chassis.

Example 7 includes the electronic device of any one of examples 1-6, wherein the microphone is coupled to the chassis without either of a printed circuit board or a flexible printed circuit between the microphone and the circular area of the chassis.

Example 8 includes the electronic device of any one of examples 1-7, further including an electrical circuit embedded on the interior surface of the chassis for electrical connection to the microphone.

Example 9 includes the electronic device of example 8, wherein the microphone is soldered to the electrical circuit in the chassis.

Example 10 includes the electronic device of any one of examples 8 or 9, further including at least one of a flexible printed circuit or a printed circuit board spaced apart from the microphone, the at least one of the flexible printed circuit or the printed circuit board electrically coupled to the microphone via the electrical circuit.

Example 11 includes the electronic device of any one of examples 1-10, further including a display screen adjacent the interior surface of the chassis opposite the exterior surface of the chassis, the microphone between the display screen and the chassis.

Example 12 includes the electronic device of example 1, wherein the interior surface includes a recess, the microphone within the recess.

Example 13 includes the electronic device of example 12, wherein a distal surface of the microphone farthest away from the chassis is less than 0.6 mm from the interior surface of the chassis surrounding the recess.

Example 14 includes the electronic device of any one of examples 1-13, wherein a duct length for the microphone corresponding to a distance between the exterior surface of the chassis and a proximal surface of the microphone is less than 1 mm.

Example 15 includes the electronic device of any one of examples 1-14, wherein the electronic device is a laptop and the chassis corresponds to an A cover of the laptop.

Example 16 includes an apparatus comprising a chassis having an inner surface and an outer surface, and a microphone coupled to the inner surface in alignment with an array of holes extending through the chassis to enable the microphone to detect sound generated beyond the outer surface of the chassis, the holes having diameters such that water will not pass through the holes due to surface tension of the water.

Example 17 includes the apparatus of example 16, wherein the microphone is attached directly to the inner surface of the chassis.

Example 18 includes the apparatus of any one of examples 16 or 17, wherein the microphone is coupled to the inner surface of the chassis without either a filter or a gasket between the microphone and the chassis.

Example 19 includes the apparatus of any one of examples 16-18, wherein the chassis includes a molded plastic with electronic traces and solder pads formed therein, the microphone directly soldered to the solder pads.

Example 20 includes the apparatus of example 19, further including at least one of a flexible printed circuit or a printed circuit board adjacent the microphone, the at least one of the flexible printed circuit or the printed circuit board electrically coupled to the microphone via the electronic traces.

Example 21 includes the apparatus of example 20, further including a spring contact connector on the at least one of the flexible printed circuit or the printed circuit board, the spring contact connector to electrical connect to a contact pad in the chassis and electrically coupled to the electronic traces.

Example 22 includes the apparatus of any one of examples 16-21, further including a display screen adjacent the chassis, the microphone between the display screen and the chassis.

Example 23 includes the apparatus of any one of examples 16-22, wherein a distance between the inner surface of the chassis on which the microphone is coupled and a distal surface of the microphone farthest away from the chassis is less than 1 mm.

Example 24 includes the apparatus of any one of examples 16-23, wherein the diameters of the holes are less than approximately 0.2 mm.

Example 25 includes a method to manufacture an electronic device, the method including molding a chassis for the electronic device, drilling holes in the chassis, the holes dimensioned and spaced relative one another to fit within a 1 mm diameter circular area of the chassis, and attaching a microphone to the chassis adjacent the holes, the holes providing an acoustic path to pass sound through the chassis to the microphone.

Example 26 includes the method of example 25, wherein the holes are approximately 0.1 mm in diameter.

Example 27 includes the method of any one of examples 25 or 26, further including forming an electrical circuit on an inner surface of the chassis adjacent the circular area of the chassis, and soldering the microphone to the electrical circuit.

Example 28 includes the method of example 27, further including attaching at least one of a printed circuit board or a flexible printed circuit to the chassis to be electrically coupled to the electrical circuit.

Example 29 includes the method of any one of examples 25-28, further including connecting a display screen to the chassis, the microphone to be between the display screen and the chassis.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An electronic device comprising:
   a chassis having an exterior surface and an interior surface, the chassis including a plurality of holes extending through the chassis, the plurality of holes within a 1 mm diameter circular area of the chassis, the interior surface including an electrical circuit embedded therein; and
   a microphone directly attached to the interior surface of the chassis adjacent the circular area of the chassis, the microphone electrically coupled to the electrical circuit embedded in the interior surface.

2. The electronic device of claim 1, wherein at least one of the plurality of holes has a diameter of approximately 0.1 mm.

3. The electronic device of claim 1, wherein a distance between centers of different ones of the plurality of holes is less than 0.3 mm.

4. The electronic device of claim 1, wherein a combined area of openings associated with the plurality of holes corresponds to at least 30% of the circular area.

5. The electronic device of claim 1, wherein the microphone is coupled to the chassis without a filter between the microphone and the circular area of the chassis.

6. The electronic device of claim 1, wherein the microphone is coupled to the chassis without a gasket between the microphone and the circular area of the chassis.

7. The electronic device of claim 1, wherein the microphone is coupled to the chassis without either of a printed circuit board or a flexible printed circuit between the microphone and the circular area of the chassis.

8. The electronic device of claim 1, further including at least one of a flexible printed circuit or a printed circuit board spaced apart from the microphone, the at least one of the flexible printed circuit or the printed circuit board electrically coupled to the microphone via the electrical circuit.

9. The electronic device of claim 1, further including a display screen adjacent the interior surface of the chassis opposite the exterior surface of the chassis, the microphone between the display screen and the chassis.

10. The electronic device of claim 1, wherein the interior surface includes a recess, the microphone within the recess.

11. The electronic device of claim 1, wherein a duct length for the microphone corresponding to a distance between the exterior surface of the chassis and a proximal surface of the microphone is less than 1 mm.

12. The electronic device of claim 1, wherein the electronic device is a laptop and the chassis corresponds to an A cover of the laptop.

13. The electronic device of claim 1, wherein the holes have diameters such that water will not pass through the holes due to surface tension of the water.

14. The electronic device of claim 1, wherein the chassis includes a molded plastic with the electrical circuit therein, the electrical circuit including electronic traces and solder pads, the microphone directly soldered to the solder pads.

15. The electronic device of claim 1, wherein a distance between the interior surface of the chassis which the microphone is attached and a distal surface of the microphone farthest away from the chassis is less than 1 mm.

16. The electronic device of claim 1, wherein the microphone is coupled to the interior surface of the chassis without a filter and without a gasket between the microphone and the chassis.

17. The electronic device of claim 1, wherein the microphone and the electrical circuit in the chassis are coupled by solder.

18. The electronic device of claim 8, further including a spring contact connector on the at least one of the flexible printed circuit or the printed circuit board, the spring contact connector to electrical connect to a contact pad in the chassis, the spring contact connector to be electrically coupled to the electrical circuit via the contact pad.

19. The electronic device of claim 1, wherein the interior surface is recessed relative to a main inner surface of the chassis, the main inner surface opposite the exterior surface.

20. The electronic device of claim 19, wherein the microphone includes a proximal surface facing the interior surface and a distal surface farthest away from the interior surface, the main inner surface farther away from the exterior surface than the proximal surface is from the exterior surface, the distal surface farther away from the exterior surface than the main inner surface is from the exterior surface.

21. The electronic device of claim 19, wherein the electrical circuit is embedded in the recessed interior surface and spaced apart from the main inner surface.

22. The electronic device of claim 20, wherein the distal surface of the microphone is less than 0.6 mm from the main inner surface of the chassis.

* * * * *